(12) United States Patent
Takano et al.

(10) Patent No.: US 6,214,156 B1
(45) Date of Patent: Apr. 10, 2001

(54) SEMICONDUCTOR DEVICE MOUNTED ON BOARD BY FLIP-CHIP AND METHOD FOR MOUNTING THE SAME

(75) Inventors: Eiji Takano, Yokohama; Shinya Shimizu, Oita, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/336,674

(22) Filed: Jun. 21, 1999

Related U.S. Application Data

(62) Division of application No. 08/819,935, filed on Mar. 18, 1997.

(30) Foreign Application Priority Data

Mar. 19, 1996 (JP) .................................................... 8-062847

(51) Int. Cl.[7] .................................................. H05K 3/30
(52) U.S. Cl. ........................................... 156/299; 29/832
(58) Field of Search .................................... 438/108, 118; 29/832; 361/760, 783; 257/696, 697, 778, 780, 784; 156/60, 250, 256, 267, 297, 299

(56) References Cited

U.S. PATENT DOCUMENTS

| | | | |
|---|---|---|---|
| 5,189,507 | 2/1993 | Carlomagno et al. | 257/777 |
| 5,719,440 | 2/1998 | Moden | 257/697 |
| 5,742,100 | 4/1998 | Schroeder et al. | 257/778 |
| 5,813,115 | * 9/1998 | Misawa et al. | 29/832 |
| 5,889,326 | * 3/1999 | Tanaka | 257/737 |
| 5,917,707 | * 6/1999 | Khandros et al. | 361/776 |

* cited by examiner

Primary Examiner—Michael W. Ball
Assistant Examiner—John T. Haran
(74) Attorney, Agent, or Firm—Finnegan, Henderson, Farabow, Garrett & Dunner, L.L.P.

(57) ABSTRACT

One-side ends of fine metal wires are bonded onto pads of a semiconductor chip via wire bonding and the other ends of the fine metal wires are mounted on the board by flip chip.

5 Claims, 2 Drawing Sheets

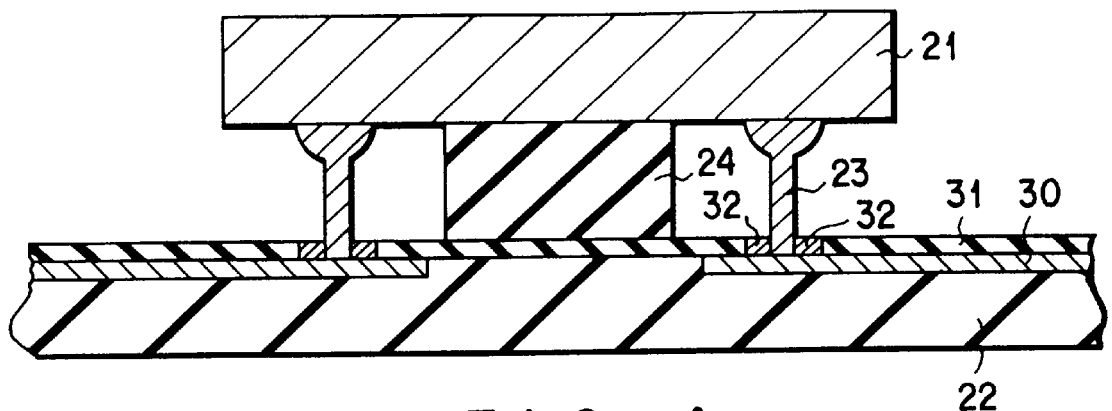
F I G. 4
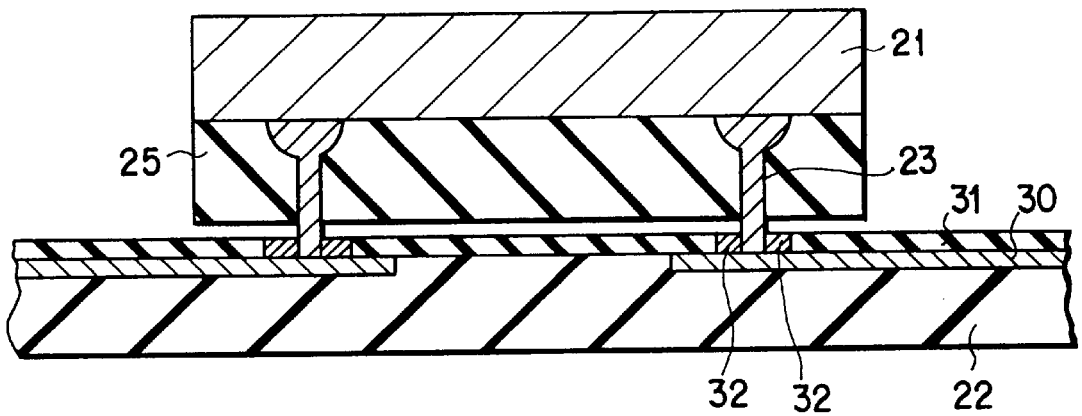
F I G. 5A
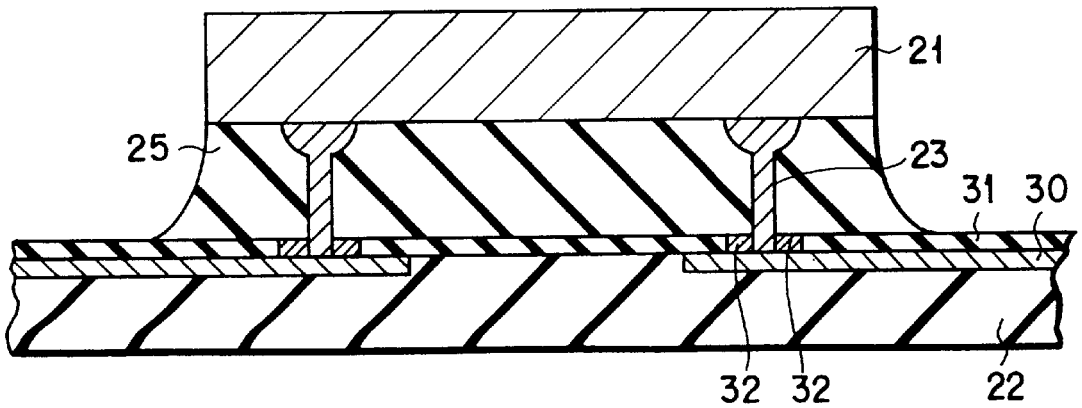
F I G. 5B

SEMICONDUCTOR DEVICE MOUNTED ON BOARD BY FLIP-CHIP AND METHOD FOR MOUNTING THE SAME

This is a division of U.S. application Ser. No. 08/819,935, filed Mar. 18, 1997, all of which are incorporated herein by reference.

BACKGROUND OF THE INVENTION

This invention relates to a semiconductor device mounted on a board by flip-chip and a method for mounting the same.

Conventionally, a semiconductor device mounted on a board by flip-chip is mounted by inserting solder bumps 13 between pad portions of a semiconductor chip 11 and a board 12 as shown in FIG. 1 and reflowing and melting the solder bumps 13 to electrically connect the pad portions of the semiconductor chip 11 to the board 12.

However, in the above flip-chip type semiconductor device and the mounting method thereof, since the thermal expansion coefficients of the semiconductor chip 11 and the board 12 are different from each other, the solder bump 13 is liable to be destroyed after the surface mounting because of the difference in the thermal expansion between the semiconductor chip 11 and the board 12, thereby causing poor electrical connection. For example, the thermal expansion coefficient of silicon used for the semiconductor chip 11 is approximately 5 [$\times 10^{-6}$/° C.] and the thermal expansion coefficient of glass epoxy used for the board 12 is 11 to 12 [$\times 10^{-6}$/° C.].

BRIEF SUMMARY OF THE INVENTION

Accordingly, a first object of this invention is to provide a semiconductor device capable of suppressing occurrence of poor connection after the surface mounting due to a difference in the thermal expansion between the semiconductor chip and the board.

A second object of this invention is to provide a method for mounting a semiconductor device which can suppress occurrence of poor connection after the surface mounting due to a difference in the thermal expansion between the semiconductor chip and the board.

The above first object of this invention can be attained by a semiconductor device comprising a semiconductor chip having a plurality of pads formed thereon; and a plurality of fine metal wires (bonding wires) connected at one end onto the pads of the semiconductor chip by wire bonding, wherein the other ends of the plurality of fine metal wires are mounted on a board by flip-chip.

With the above structure, since stress caused by a difference in the thermal expansion between the semiconductor chip and the board can be absorbed by utilizing the flexible bending action of the fine metal wires, occurrence of poor connection after the surface mounting due to a difference in the thermal expansion can be suppressed.

Further, the above first object of this invention can be attained by a semiconductor device comprising a semiconductor chip having a plurality of pads formed thereon; and a plurality of fine metal wires (bonding wires) connected at one end onto the pads of the semiconductor chip by wire bonding and each: having a bent portion, wherein the bent portions of the plurality of fine metal wires are mounted on a board by flip-chip.

With the above structure, since stress caused by a difference in the thermal expansion between the semiconductor chip and the board can be absorbed by utilizing the flexible bending action of the fine metal wires, occurrence of poor connection after the surface mounting due to a difference in the thermal expansion can be suppressed. In addition, since the fine metal wire is bent and the bent portion is mounted on the board, the mechanical strength of the connecting portion can be enhanced and the mounting strength can be enhanced. Further, it is possible to use fine metal wires.

The above second object of this invention can be attained by a method for mounting a semiconductor device, comprising the steps of bonding one-side ends of fine metal wires (bonding wires) on pads of a semiconductor chip by a wire bonding method; pulling up the fine metal wires and cutting apart the fine metal wires when the fine metal wires are pulled up by a preset length; and mounting the other ends of the fine metal wires formed on the semiconductor chip onto a board.

With the above mounting method, since stress caused by a difference in the thermal expansion between the semiconductor chip and the board can be absorbed by utilizing the flexible bending action of the fine metal wires, occurrence of poor connection after the surface mounting due to a difference in the thermal expansion can be suppressed. In addition, since connecting portions used in place of solder bumps are formed by use of the conventional wire bonding technique, the manufacturing process can be simplified and the manufacturing cost can be lowered in comparison with a case wherein the solder bumps are used.

Further, the above second object of this invention can be attained by a method for mounting a semiconductor device, comprising the steps of first-bonding one-side ends of fine metal wires (bonding wires) on pads of a semiconductor chip by a wire bonding method; pulling up the fine metal wires and pulling down and bending the fine metal wires when the fine metal wires are pulled up by a preset length; second-bonding the fine metal wires on the semiconductor chip and then cutting apart the fine metal wires; and mounting the bent portions of the fine metal wires on a board.

With the above mounting method, since stress caused by a difference in the thermal expansion between the semiconductor chip and the board can be absorbed by utilizing the flexible bending action of the fine metal wires, occurrence of poor connection after the surface mounting due to a difference in the thermal expansion can be prevented. Further, since connecting portions used in place of solder bumps are formed by use of the conventional wire bonding technique, the manufacturing process can be simplified and the manufacturing cost can be lowered in comparison with a case wherein the solder bumps are used. In addition, since the fine metal wires are bent and the bent portions are mounted on the board, the mechanical strength of the connecting portion can be enhanced and the mounting strength can be enhanced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a cross sectional view for illustrating a semiconductor device according to a third embodiment of this invention and a method for mounting the same;

FIG. 5A is a cross sectional view showing a state before reflow, for illustrating a semiconductor device according to a fourth embodiment of this invention and a method for mounting the same; and FIG. 5B is a cross sectional view showing a state after reflow, for illustrating the semiconductor device according to the fourth embodiment of this invention and a method for mounting the same.

DETAILED DESCRIPTION OF THE INVENTION

Figure 1:
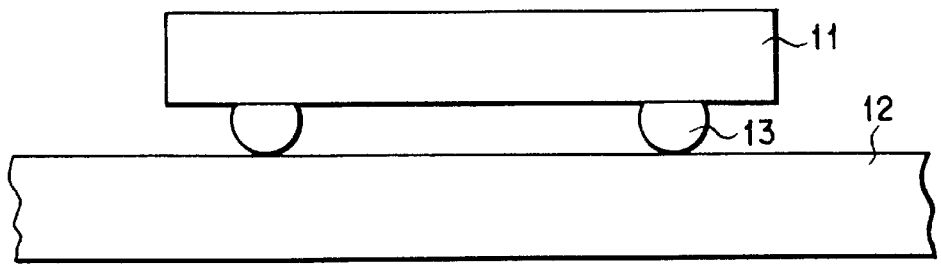
FIG. 1 is a side view for illustrating a conventional semiconductor device mounted on a board by flip chip and a method for mounting the same.
Figure 2A:
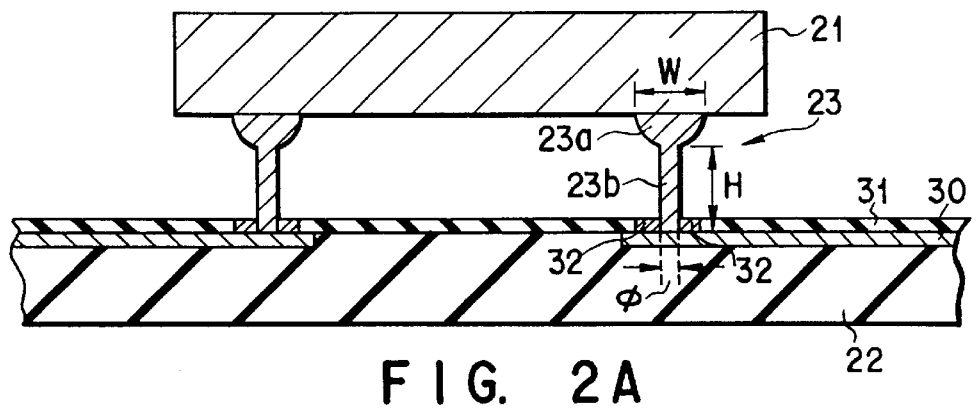
FIG. 2A is a cross sectional view for illustrating a semiconductor device according to a first embodiment of this invention and a method for mounting the same.
Figure 2B:
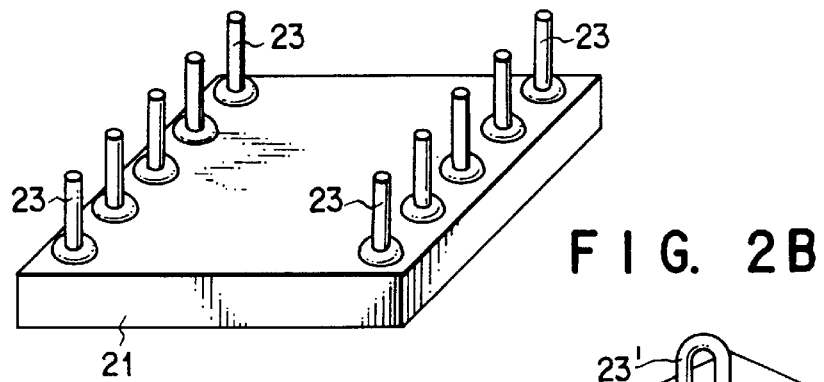
FIG. 2B is a perspective view of a semiconductor chip as viewed from the mounting surface side, for illustrating the semiconductor device according to the first embodiment of this invention and a method for mounting the same.

FIGS. 2A and 2B are views for illustrating a semiconductor device according to a first embodiment of this invention and a method for mounting the same, and FIG. 2A is a cross sectional view showing the state in which a semiconductor device is mounted on a board and FIG. 2B is a perspective view of the semiconductor chip as viewed from the mounting surface side. A semiconductor chip 21 is mounted on a board 22 by use of bonding wires (fine metal wires) 23. A wiring layer 30 formed of aluminum (Al), for example, is formed on the mounting surface side of the board 22 and a protection film 31 is formed on the wiring layer 31. Openings are formed in portions of the protection film 31 which lie on the wiring layer 30. The bonding wires 23 are electrically connected to corresponding portions of the wiring layer 30 via respective soldering paste layers 32. The bonding wire 23 is formed of gold (Au), copper (Cu) or the like and is formed with a thickness and length suitable for holding the semiconductor chip 21 and absorbing stress caused by a difference in the thermal expansion between the semiconductor chip 21 and the board 22 by utilizing the flexible bending action. For example, the width of a ball portion 23a is 100 μm, the diameter φ of a wire portion 23b is 50 μm, and the height H thereof is 100 μm.

Next, a method for mounting the semiconductor device is explained. First, the ball portion 23a is bonded to the pad portion of the semiconductor chip 21 by the wire bonding technique, and then the wire portion 23b is pulled up and cut apart by use of a cutter or partly melted away by use of a torch when the wire portion has been pulled up by a preset length. The same operation is repeatedly effected to bond the bonding wires 23 to all of the pad portions of the semiconductor chip 21.

After this, the semiconductor chip 21 is mounted on the board 22 by disposing the semiconductor chip 21 on the board 22 on which the soldering paste layers 32 are formed in positions corresponding to portions to be connected to the bonding wires 23 by screen printing or the like, inserting the same into a reflow furnace and effecting the reflow process.

According to the above structure and mounting method, since stress caused by a difference in the thermal expansion between the semiconductor chip 21 and the board 22 can be absorbed by utilizing the flexible bending action of the bonding wires 23, occurrence of poor connection after the surface mounting due to a difference in the thermal expansion can be suppressed. Further, mounting of the semiconductor chip on the board 22 can be effected in the same manner as in the conventional flip chip connection step by reflowing the soldering paste layers 32 formed in positions corresponding to portions to be connected to the bonding wires 23 and the mounting process will not become complicated. In addition, since the connecting portions used in place of solder bumps are formed by use of the conventional wire bonding technique, the manufacturing process can be simplified and the manufacturing cost can be lowered in comparison with a case wherein the solder bumps are used.

Figure 3:
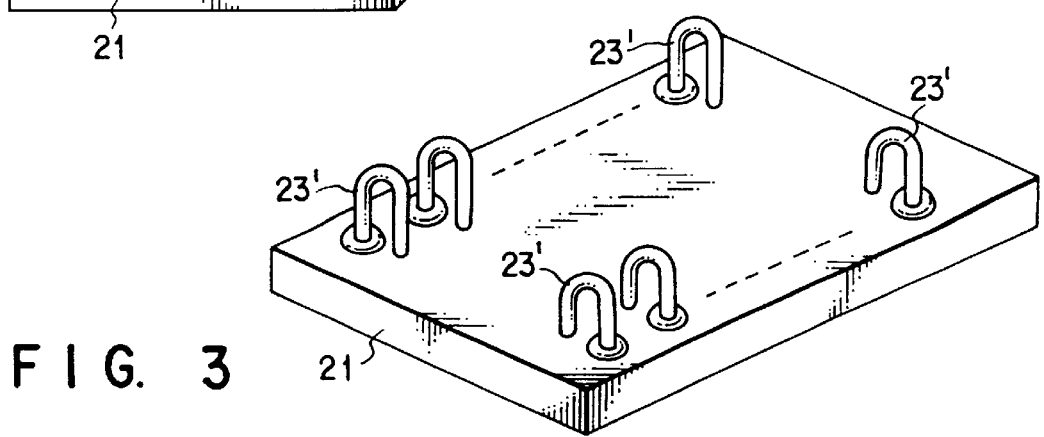
FIG. 3 is a perspective view of a semiconductor chip as viewed from the mounting surface side, for illustrating a semiconductor device according to a second embodiment of this invention and a method for mounting the same.

FIG. 3 is a perspective view for illustrating a semiconductor device according to a second embodiment of this invention and a method for mounting the same. In the semiconductor device according to this embodiment, bonding wires 23' are bent and the bent portions are connected to the board. With this structure, since the mechanical strength of the connecting portion is enhanced, the mounting strength can be enhanced and sufficiently high mounting strength can be attained even by use of the fine bonding wires 23'.

The structure shown in FIG. 3 can be obtained by first-bonding a ball portion to the pad portion of the semiconductor chip 21 by the wire bonding technique, pulling up the wire 23' and then pulling down the same, second-bonding the wire on the pad portion or on an insulating film such as a passivation film formed on the surface of the semiconductor chip 21, and then cutting apart the wire 23'. The same operation is repeatedly effected to bond the bonding wires 23' to all of the pad portions of the semiconductor chip 21.

According to the above manufacturing method, since the height and curvature of the bent portions can be set with high precision by use of the loop control in the wire bonding technique, the manufacturing process can be simplified, the manufacturing cost can be lowered and the manufacturing precision can be made high.

FIG. 4 is a cross sectional view for illustrating a semiconductor device according to a third embodiment of this invention and a method for mounting the same, an adhesive tape 24 is provided between a semiconductor chip 21 and a board 22, and the semiconductor chip 21 and the board 22 are fixed together by use of the adhesive tape 24. As bonding wires, the bonding wires used in the first and second embodiments can be used.

According to the above structure and mounting method, the mounting strength can be further enhanced in comparison with the first and second embodiments in which the semiconductor chip 21 is mounted on the board 22 by use of the bonding wires 23, 23'.

FIGS. 5A and 5B are cross sectional views showing states before and after reflow, for illustrating a semiconductor device according to a fourth embodiment of this invention and a method for mounting the same. First, like the first and second embodiments, bonding wires 23 are formed. Then, a thermoplastic resin sheet 25 as shown in FIG. 5A is formed between a semiconductor chip 21 and a board 22 having soldering paste layers 32 formed thereon. The thickness of the resin sheet 25 is set larger than the height of the ball portion and smaller than the distance between the semiconductor chip 21 and the substrate 22 and is set to approx. 100 to 200 μm, for example. The semiconductor chip 21 and the board 22 are inserted into a reflow furnace and the reflow process is effected at a temperature of 240° C., for example. As a result, the soldering paste layers 32 formed on the substrate 22 are melted to bond the bonding wires 23 on the board 22 and mount the semiconductor chip 21 on the board 22. At this time, in the reflow process for mounting, the thermoplastic resin sheet 25 is melted to fix together the semiconductor chip 21 and the board 22 as shown in FIG. 5B.

According to the above structure and manufacturing method, since the semiconductor chip 21 and the board 22 are fixed together by use of thermoplastic resin, the mounting strength can be further enhanced in comparison with the first and second embodiments. Further, in the reflow process for flip chip connection, since the thermoplastic resin sheet 25 is melted to fix together the semiconductor chip 21 and the board 22, the conventional reflow furnace and the reflow process can be utilized as they are and the manufacturing process will not become complicated.

If the semiconductor chip 21 is formed as a memory, 40 to 50 pins or more pins are used, and therefore, sufficiently high mounting strength can be attained with the structure of the first and second embodiments, but in a case where the number of pins used is small, the mounting strength becomes low. Such a problem can be solved by using the structure and manufacturing method shown in the third and fourth embodiments.

This invention is not limited to the first to fourth embodiments described above and can be variously modified without departing from the technical scope thereof. For example, if the bonding wires 23, 23' in the above embodiments are previously plated with solder, the wettability of solder to the substrate can be enhanced. Further, a case wherein the bonding wires 23, 23' are formed along the two opposite sides of the semiconductor chip 21 is explained as an example, but they can be formed along the four sides thereof or on the entire surface thereof. A case wherein the bonding wires 23, 23' are linearly arranged is explained as an example, but they can be arranged in a staggered form.

As described above, according to this invention, a semiconductor device and a method for mounting the same can be attained in which occurrence of poor connection after the surface mounting due to a difference in the thermal expansion between the semiconductor chip and the board can be prevented.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for mounting a semiconductor device, comprising the steps of:
    first-bonding one-side ends of fine metal wires on pads a semiconductor chip by a wire bonding method;
    pulling up said fine metal wires and pulling down and bending said fine metal wires when said fine metal wires are pulled up by a preset length;
    second-bonding said fine metal wires on said semiconductor chip and then cutting fine metal wires, thereby forming two wires with bent portions: and
    mounting the bent portions of said fine metal wires on a substrate.

2. The semiconductor device mounting method according to claim 1, wherein said mounting step includes a step of disposing said semiconductor chip on the board having soldering paste layers formed in positions corresponding to portions to be connected to said fine metal wires; and a step of effecting a reflow process to melt said soldering paste layers and bond said fine metal wires on the substrate.

3. The semiconductor device mounting method according to claim 1, wherein said mounting step includes a step of disposing an adhesive tape between said semiconductor chip and the board to fix together said semiconductor chip and the board via said adhesive tape.

4. The semiconductor device mounting method according to claim 1, wherein said mounting step includes a step of disposing thermoplastic resin between said semiconductor chip and the board; and a step of effecting a reflow process to bond said fine metal wires to the board and melting said thermoplastic resin to fix together said semiconductor chip and the board.

5. The semiconductor device mounting method according to claim 1, further comprising a step of plating said fine metal wires with solder before said mounting step.

* * * * *

UNITED STATES PATENT AND TRADEMARK OFFICE
CERTIFICATE OF CORRECTION

PATENT NO. : 6,214,156 B1  
DATED : April 10, 2001  
INVENTOR(S) : Eiji Takano et al.

Page 1 of 1

It is certified that error appears in the above-identified patent and that said Letters Patent is hereby corrected as shown below:

<u>Column 6, claim 1,</u>  
Line 12, after "pads", insert -- of --.  
Line 19, "bent portions:" should read -- bent portions; --.

Signed and Sealed this

Second Day of April, 2002

Attest:

*Attesting Officer*

JAMES E. ROGAN  
*Director of the United States Patent and Trademark Office*